(12) United States Patent
Chang et al.

(10) Patent No.: US 12,324,287 B2
(45) Date of Patent: Jun. 3, 2025

(54) DISPLAY APPARATUS USING SEMICONDUCTOR LIGHT EMITTING DEVICE

(71) Applicant: LG ELECTRONICS INC., Seoul (KR)

(72) Inventors: Jaewon Chang, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 588 days.

(21) Appl. No.: 17/631,204

(22) PCT Filed: Aug. 27, 2019

(86) PCT No.: PCT/KR2019/095032
§ 371 (c)(1),
(2) Date: Jan. 28, 2022

(87) PCT Pub. No.: WO2021/025243
PCT Pub. Date: Feb. 11, 2021

(65) Prior Publication Data
US 2022/0278260 A1 Sep. 1, 2022

(30) Foreign Application Priority Data
Aug. 6, 2019 (KR) .......... 10-2019-0095358

(51) Int. Cl.
H01L 21/78 (2006.01)
H01L 25/075 (2006.01)
H10H 20/857 (2025.01)

(52) U.S. Cl.
CPC ....... *H10H 20/857* (2025.01); *H01L 25/0753* (2013.01)

(58) Field of Classification Search
CPC . H01L 33/62; H01L 25/0753; H01L 27/1244; H01L 33/504; H01L 25/167;
(Continued)

(56) References Cited

U.S. PATENT DOCUMENTS 6,271,543 B1 * 8/2001 Ohtani ............... H01L 27/1255
349/110
8,218,100 B2 * 7/2012 Ohtani .............. G02F 1/136209
349/39
(Continued)

FOREIGN PATENT DOCUMENTS

JP 2013004792 1/2013
KR 1020130033450 4/2013
(Continued)

OTHER PUBLICATIONS

PCT International Application No. PCT/KR2019/095032, International Search Report dated May 7, 2020, 10 pages.
(Continued)

*Primary Examiner* — Vu A Vu
(74) *Attorney, Agent, or Firm* — LEE, HONG, DEGERMAN, KANG & WAIMEY

(57) ABSTRACT

The present disclosure is applicable to a display apparatus-related technology field, and relates to, for example, a display apparatus using a micro light emitting diode (LED), which is a semiconductor light emitting device. The present invention provides a display apparatus using a light emitting device operated in an active matrix scheme, the display apparatus comprising: a substrate; a pixel area layer configuring multiple pixel areas, which are arranged on the substrate and each of which includes a light emitting area and a pixel transistor area; and an assembly wiring layer including multiple pairs of assembly wires arranged between the substrate and the pixel area layer, wherein each of the pixel areas may include a light emitting area in which a light (Continued)

emitting device is mounted, and a pixel transistor area, which is positioned in a first direction with respect to the light emitting area and in which a thin film transistor for lighting the light emitting device is disposed, and the assembly wires may be arranged in a second direction different from the first direction.

14 Claims, 25 Drawing Sheets

(58) Field of Classification Search
CPC ... H01L 27/156; H01L 27/124; H01L 29/786; H01L 33/005
USPC .......................................................... 257/79
See application file for complete search history.

(56) References Cited

U.S. PATENT DOCUMENTS

| | | | |
|---|---|---|---|
| 9,318,616 B2* | 4/2016 | Hong | H01L 29/66969 |
| 9,653,489 B2* | 5/2017 | Ota | H10K 59/131 |
| 10,707,293 B2* | 7/2020 | Takechi | H01L 27/124 |
| 11,183,553 B2* | 11/2021 | Woo | H10K 59/805 |
| 11,997,864 B2* | 5/2024 | Wang | H10K 71/40 |
| 2017/0338372 A1 | 11/2017 | Teraguchi et al. | |
| 2019/0129555 A1* | 5/2019 | Chiang | G06F 3/0445 |
| 2020/0052033 A1* | 2/2020 | Iguchi | H01L 27/156 |

FOREIGN PATENT DOCUMENTS

| | | |
|---|---|---|
| KR | 10-2018-0009015 | 1/2018 |
| KR | 1020190075869 | 7/2019 |
| KR | 1020190099149 | 8/2019 |
| WO | 2016084672 | 6/2016 |

OTHER PUBLICATIONS

Korean Intellectual Property Office Application No. 10-2019-0095358, Office Action dated Apr. 28, 2024, 6 pages.

* cited by examiner

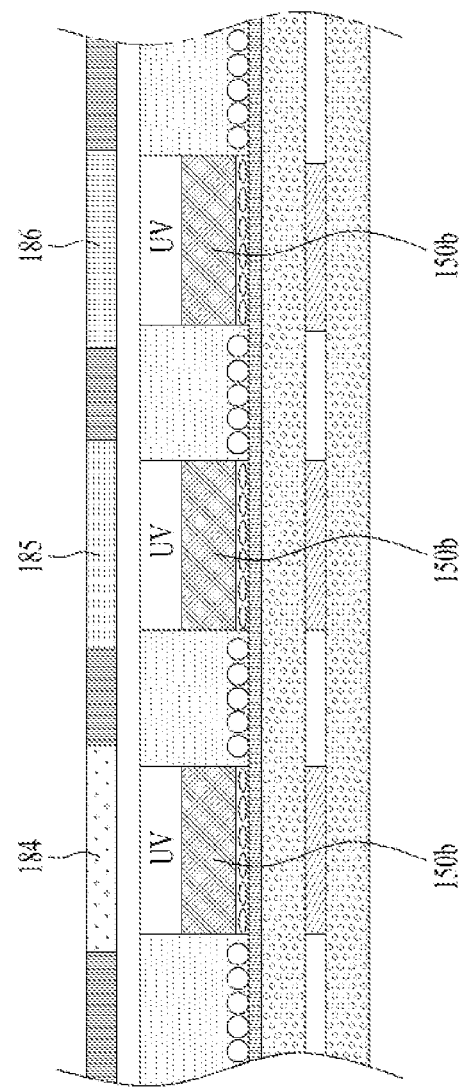

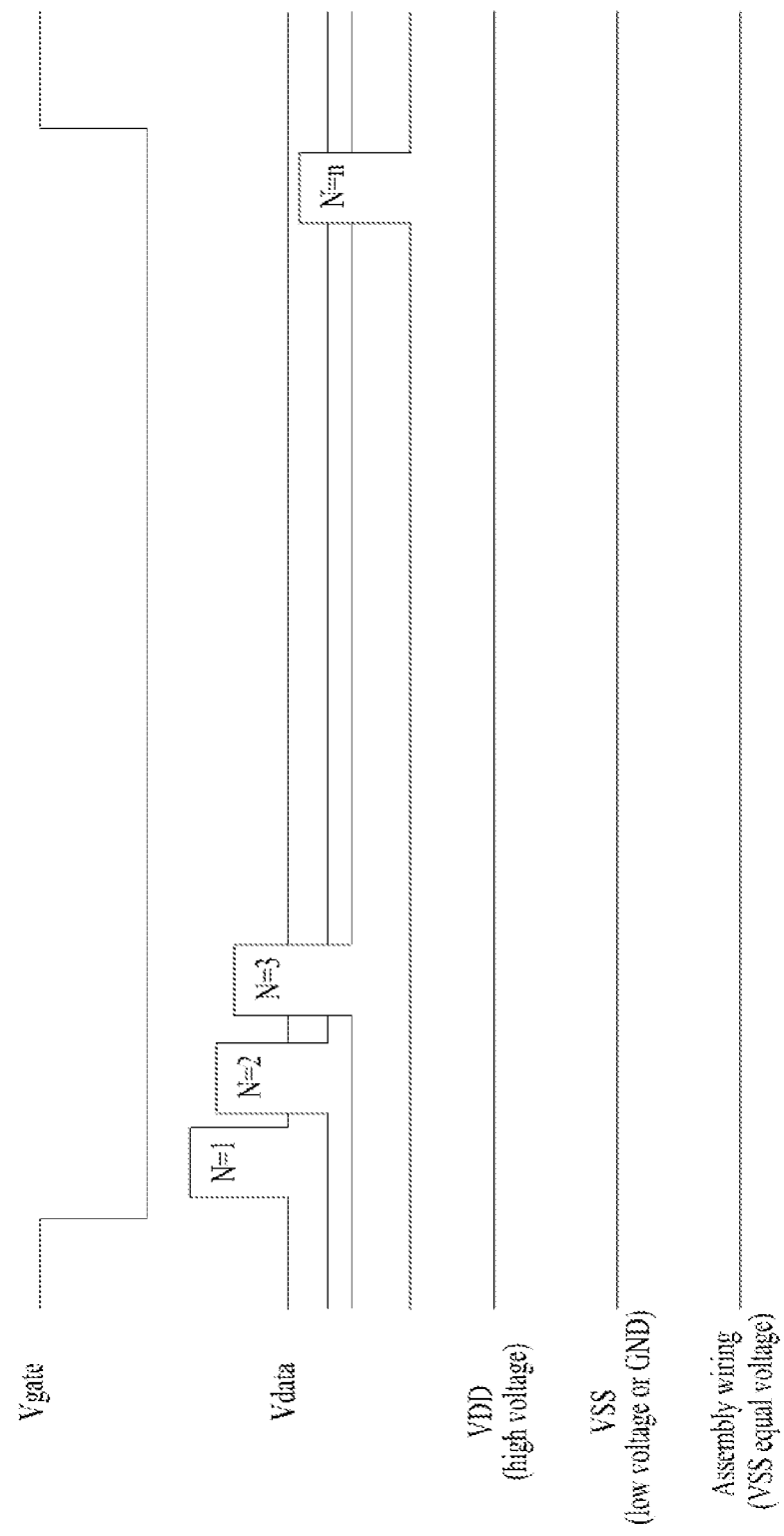

DISPLAY APPARATUS USING SEMICONDUCTOR LIGHT EMITTING DEVICE

CROSS-REFERENCE TO RELATED APPLICATIONS

This application is the National Stage filing under 35 U.S.C. 371 of International Application No. PCT/KR2019/095032, filed on Aug. 27, 2019, which claims the benefit of earlier filing date and right of priority to Korean Application No. 10-2019-0095358, filed on Aug. 6, 2019, the contents of which are all hereby incorporated by reference herein their entirety.

TECHNICAL FIELD

The present disclosure is applicable to the display device related technical fields and relates to a display device using a semiconductor light emitting element, e.g., a micro Light Emitting Diode (LED) and method for fabricating the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

The size of the semiconductor light emitting element has recently been reduced to tens of micrometers. Therefore, when implementing a display device using such small semiconductor light emitting elements, a very large number of semiconductor light emitting elements should be assembled on a wiring substrate of the display device.

In order to fabricate an active matrix structure, a photolithography process may be applied to form a wiring and a thin film transistor inside a pixel in a predetermined size.

Thus, as a multitude of wirings are formed, short circuits and interference may occur between adjacent pixels due to conductive particles and the like, thereby causing bright spot defects.

In addition, an assembly wiring required for assembly may be provided in a pixel for self-assembly of a light emitting element.

However, the characteristics of a thin film transistor for driving may be changed by the assembly wiring. For example, an overlap region may be formed in an assembly wiring region and a pixel transistor region. However, such an overlap region may act as a capacitor.

Accordingly, a negative shift effect of a transistor characteristic curve may occur, and defects such as occurrence of a bright spot error and the like due to such an effect error may occur.

As described above, when an overlap region is formed in an assembly wiring region and a pixel transistor region so that an assembly wiring passes by some or all of the thin film transistors in a pixel, an active region of the thin film transistor is activated to accumulate charges or cause inversion so that a channel may be formed. Through such a channel, a current path may be formed.

The current path formed as described above may cause leakage in the pixel, thereby resulting in a defect of distorting a data signal. That is, a crosstalk effect between an assembly wiring and a thin film transistor in a pixel may occur.

DISCLOSURE

Technical Tasks

One technical task of the present disclosure is to provide a display device using a semiconductor light emitting elements capable of preventing occurrence of a crosstalk effect between an assembly wiring and a thin film transistor in a pixel.

Another technical task of the present disclosure is to provide a display device using a semiconductor light emitting elements capable of fundamentally preventing occurrence of an effect of short circuit between a data line and a gate ON voltage line.

Further technical task of the present disclosure is to provide a display device using a semiconductor light emitting elements capable of preventing occurrence of distortion of a drive signal and stabilizing an assembly wiring.

Technical Solutions

In one technical aspect of the present disclosure, provided is a display device using a semiconductor light emitting element of an active matrix type, the display device including a substrate, a pixel region layer forming a multitude of pixel regions arranged on the substrate by including light emitting regions and pixel transistor regions, respectively, and an assembly wiring layer including a multitude of pairs of assembly wirings provided between the substrate and the pixel region layer, wherein the pixel region may include the light emitting region having the light emitting element installed therein and the pixel transistor region located in a first direction with respect to the light emitting region to turn on the light emitting element and wherein the assembly wiring may be arranged in a second direction different from the first direction.

The pixel transistor region may be provided with a driving thin film transistor provided in a first region of the substrate and a switching thin film transistor provided in a second region of the substrate.

The display device may further include a gate line connected to the switching thin film transistor, a data line connected to the switching thin film transistor, a gate OFF voltage line connected to the driving thin film transistor, and a gate ON voltage line connected to an anode of the light emitting element, and at least one of the gate line or the gate OFF voltage line may be disposed parallel with the assembly wiring.

The gate ON voltage line may be connected to the anode of the light emitting element and the gate ON voltage line may be disposed in a direction vertical to the assembly wiring.

The gate ON voltage line may be disposed on a same layer of the gate line.

The gate OFF voltage line may be electrically connected to the assembly wiring.

The data line and the gate ON voltage line may be disposed in a direction vertical to the assembly wiring.

The data line and the gate ON voltage line may be formed adjacent to each other in a multitude of the light emitting regions.

In another technical aspect of the present disclosure, provided is a display device using a semiconductor light emitting element of an active matrix type, the display device including a substrate, a pixel region layer forming a multitude of pixel regions arranged on the substrate by including light emitting regions and pixel transistor regions, respectively, and an assembly wiring layer provided between the substrate and the pixel region layer and including a pair of assembly wirings corresponding to each of the light emitting regions, wherein the pixel region may include the light emitting region having the light emitting element installed therein, the pixel transistor region located on one side of the light emitting region and provided with a thin film transistor to turn on the light emitting element, and a gate line connected to the thin film transistor, and a data line connected to the thin film transistor and arranged parallel with the assembly wiring.

The pixel transistor region may be located in a first direction with respect to the light emitting region and the assembly wiring may be arranged in a second direction vertical to the first direction.

Advantageous Effects

According to one embodiment of the present disclosure, the above-described problems can be solved.

Namely, an active region of a thin film transistor is activated to accumulate charges or cause inversion so that a channel may be formed. Hence, it is able to prevent a current path from be formed through such a channel.

The current path formed as described above may cause leakage in a pixel and result in a defect of distorting a data signal. Hence, such a defect can be prevented, thereby preventing occurrence of a crosstalk effect between an assembly wiring and a thin film transistor in a pixel.

To avoid the aforementioned crosstalk effect, it is able to provide a solution compatible with a self-assembly structure of light emitting elements assembled per color to design a wiring in a horizontal direction so that an assembly wiring can be prevented from overlapping with a thin film transistor.

Meanwhile, it is able to fundamentally prevent short circuit from occurring between a data line and a gate ON voltage line.

Moreover, since an assembly wiring is connected to a gate OFF voltage line that substantially uses ground connection frequently, a data line and a gate line can operate at an original drive voltage.

Accordingly, distortion of a drive signal does not occur and an assembly wiring can be stabilized.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 5A to 5C are conceptual diagrams illustrating various examples of color implementation with respect to a flip-chip type semiconductor light emitting element.

FIG. 22 is a signal waveform diagram of a display device using a light emitting element of an active matrix type according to a fourth embodiment of the present disclosure.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
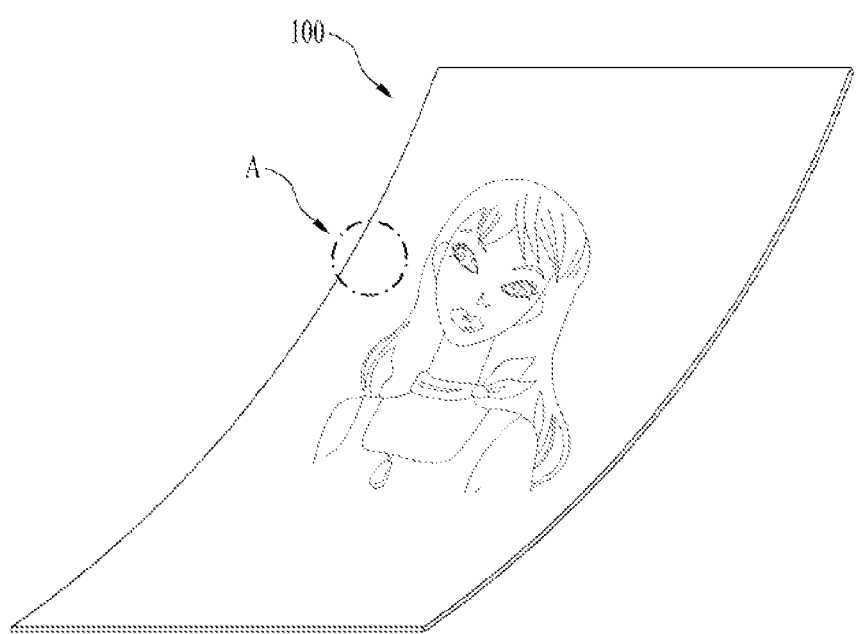
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
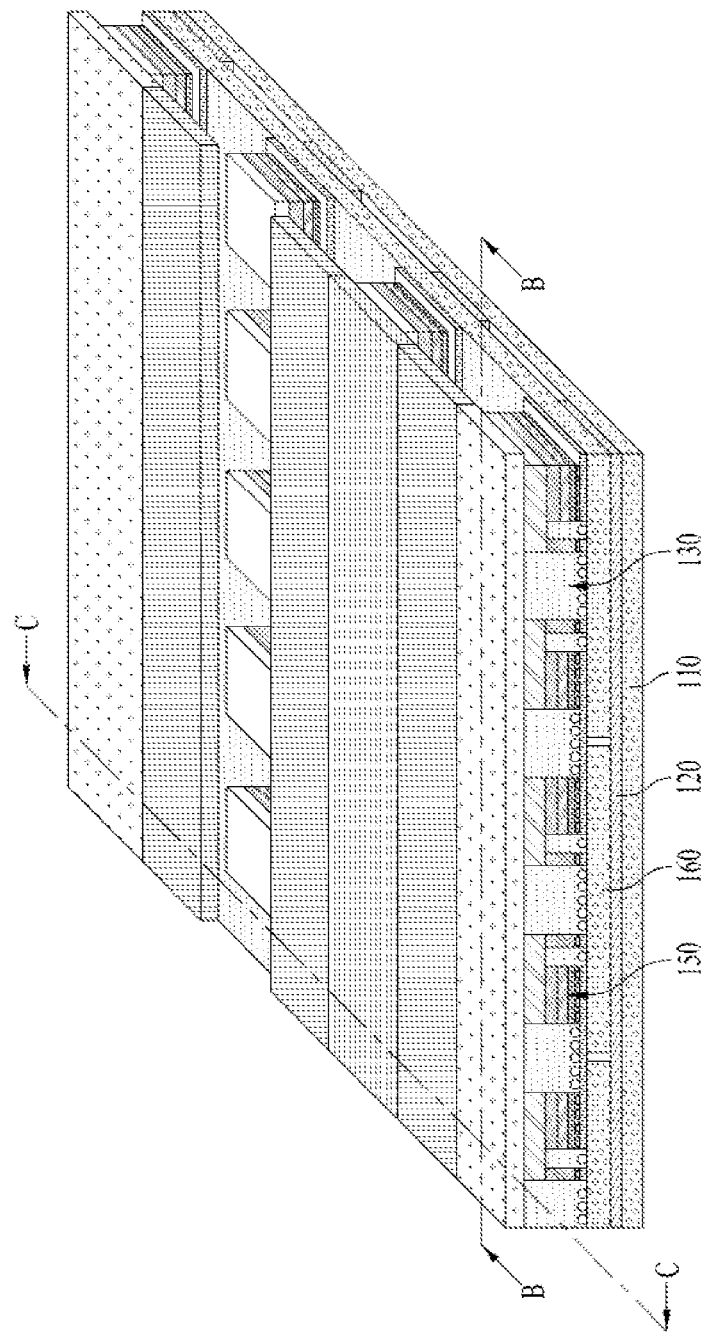
FIG. 2 is a partially enlarged diagram showing a part A shown in FIG. 1.

FIG. 2 is a partially enlarged view showing part A of FIG. 1.

Figure 3A:
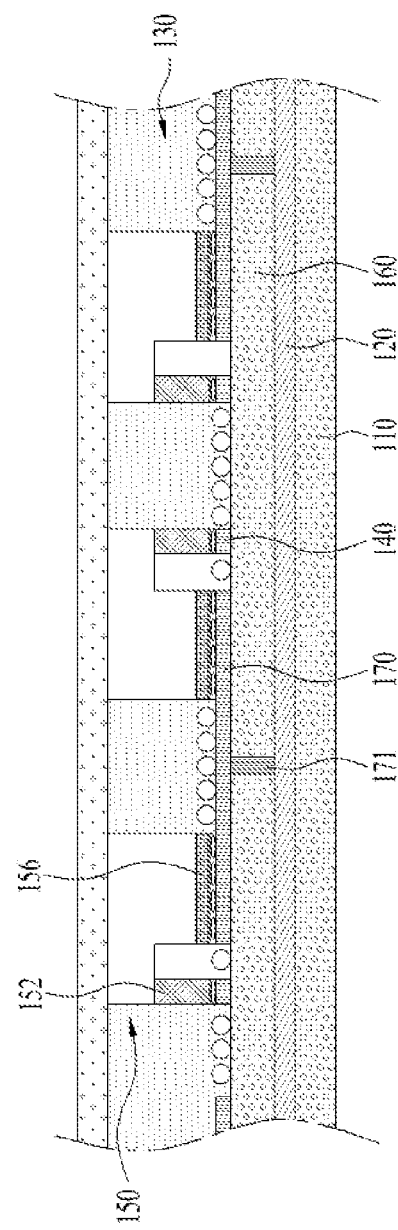
FIGS. 3A and 3B are cross-sectional diagrams taken along the cutting lines B-B and C-C in FIG. 2.
Figure 3B:
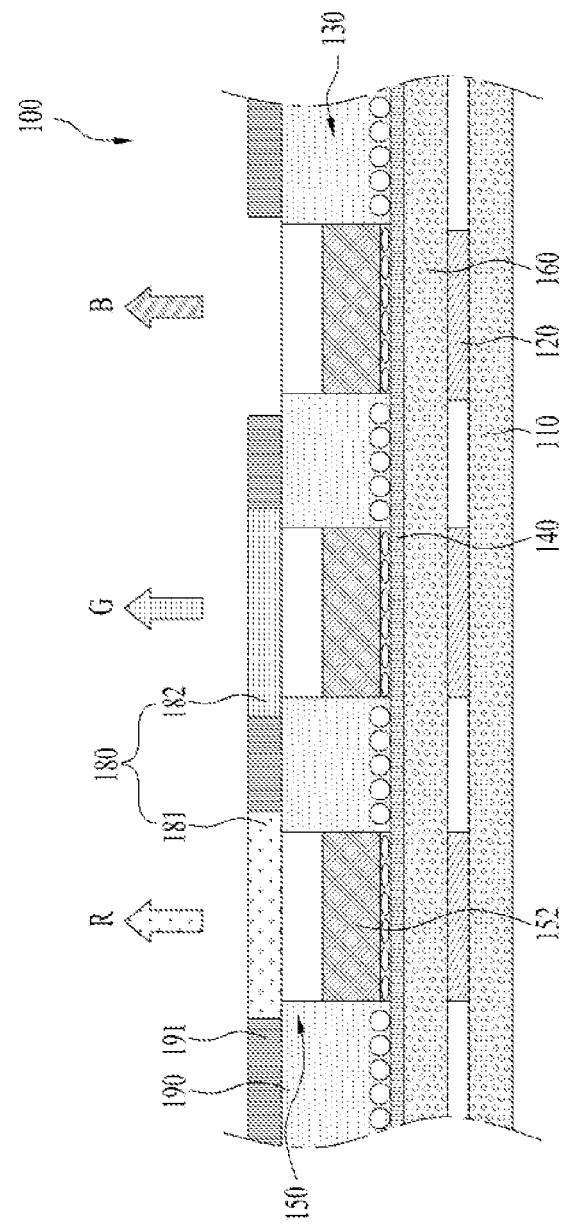

FIGS. 3A and 3B are cross-sectional views taken along lines B-B and C-C in FIG. 2.

Figure 4:
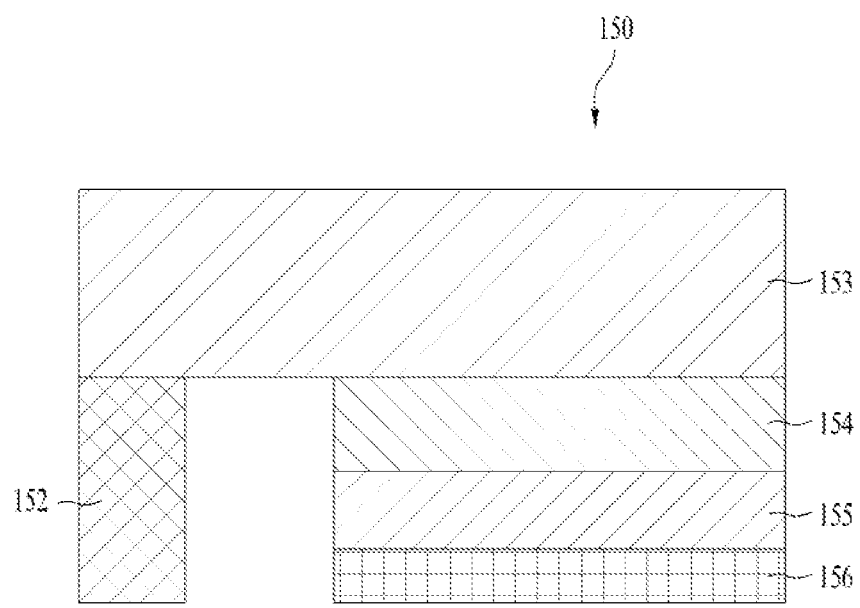
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
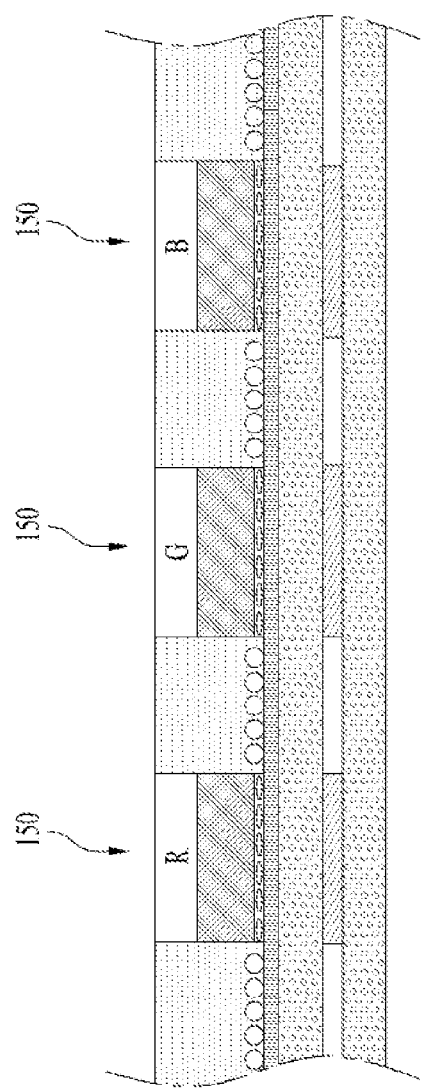
Figure 5B:
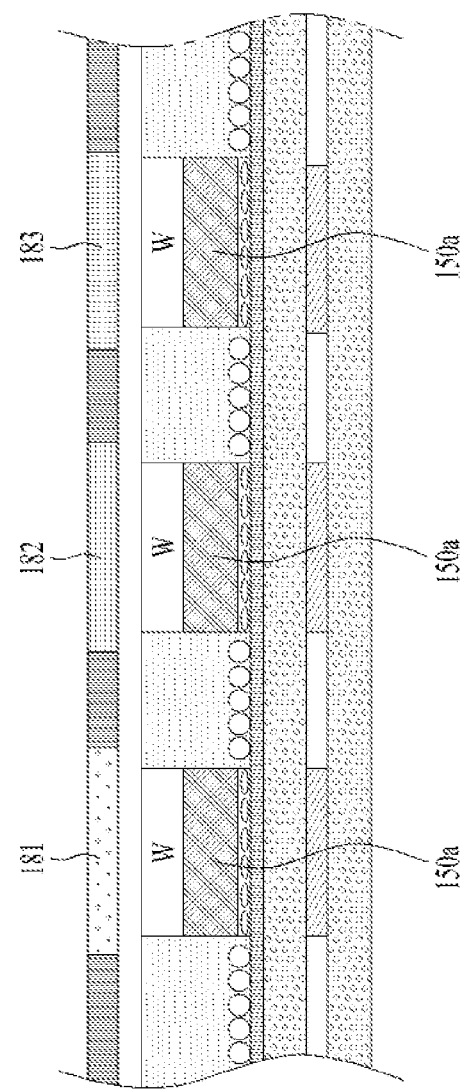

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
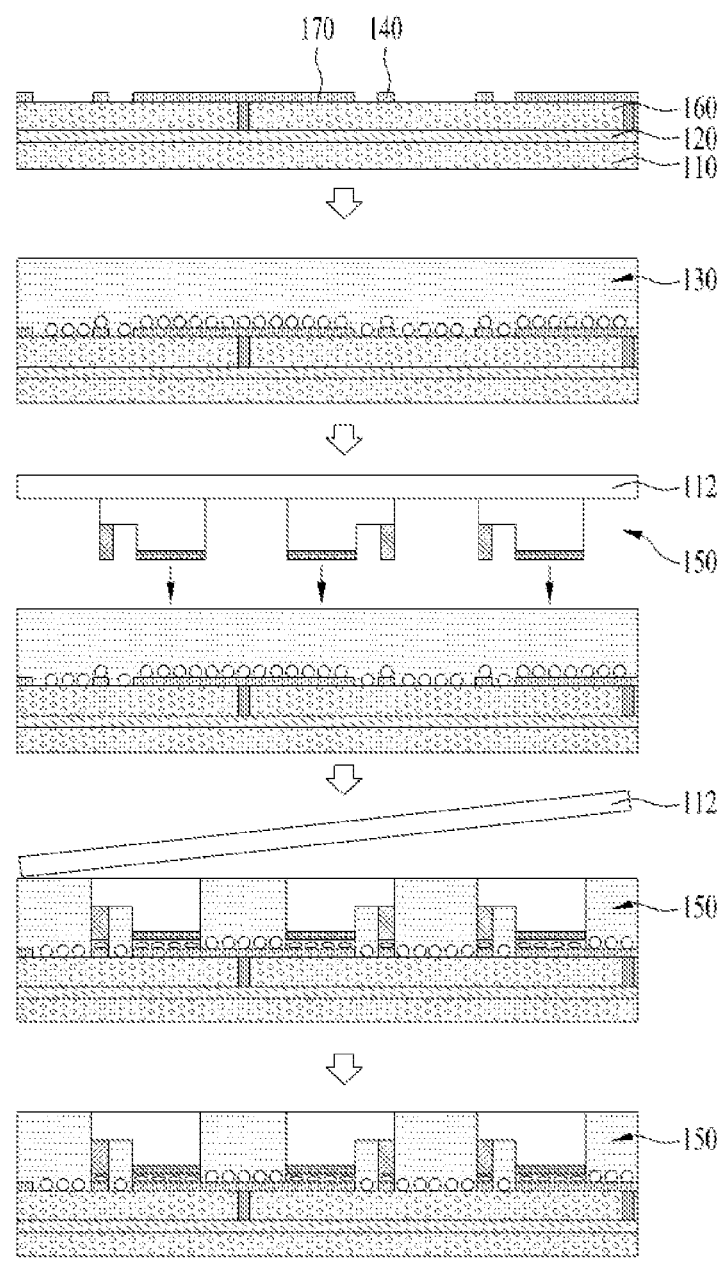
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
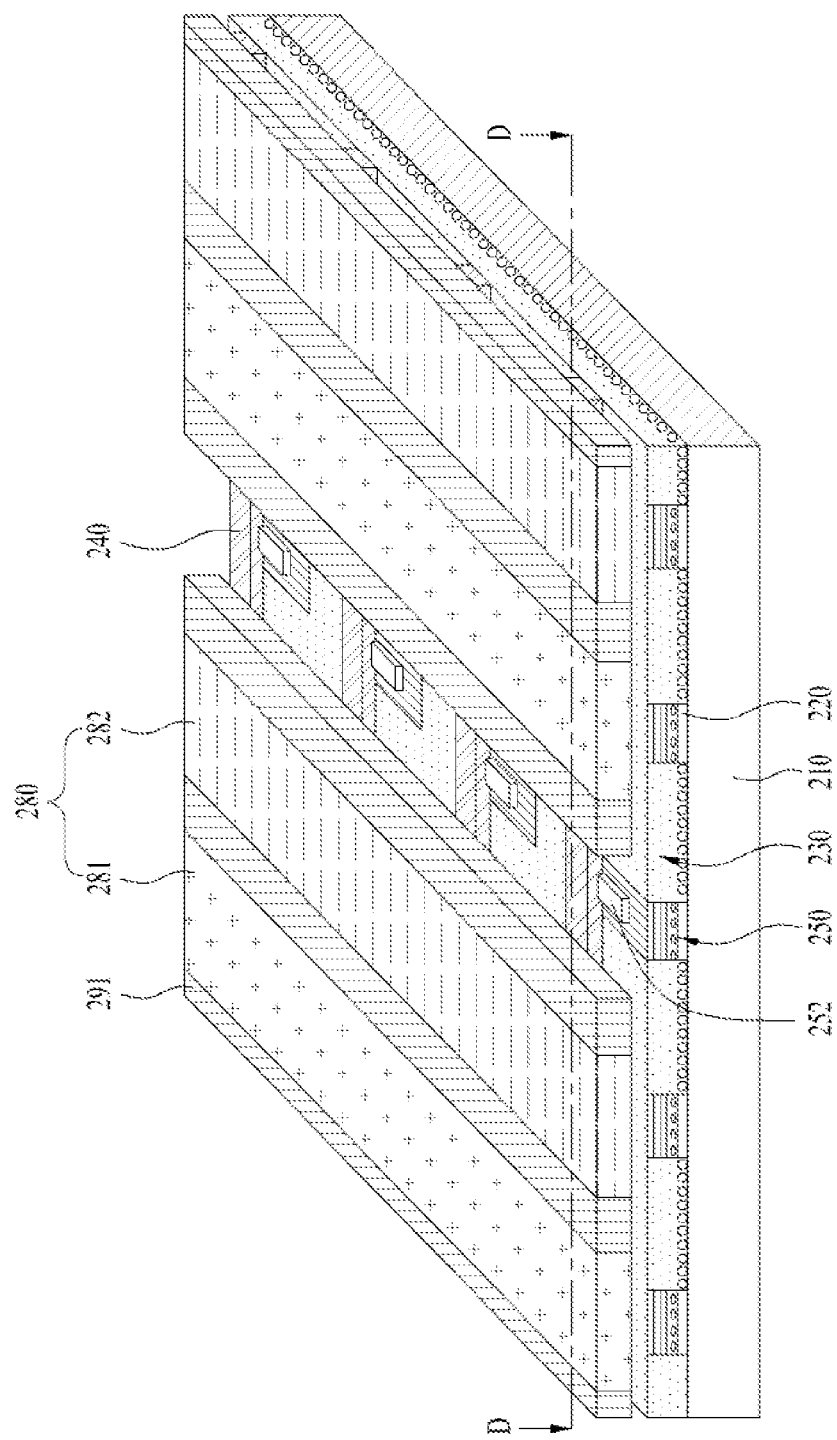
FIG. 7 is a perspective diagram of a display device using a semiconductor light emitting element according to another embodiment of the present disclosure.
Figure 8:
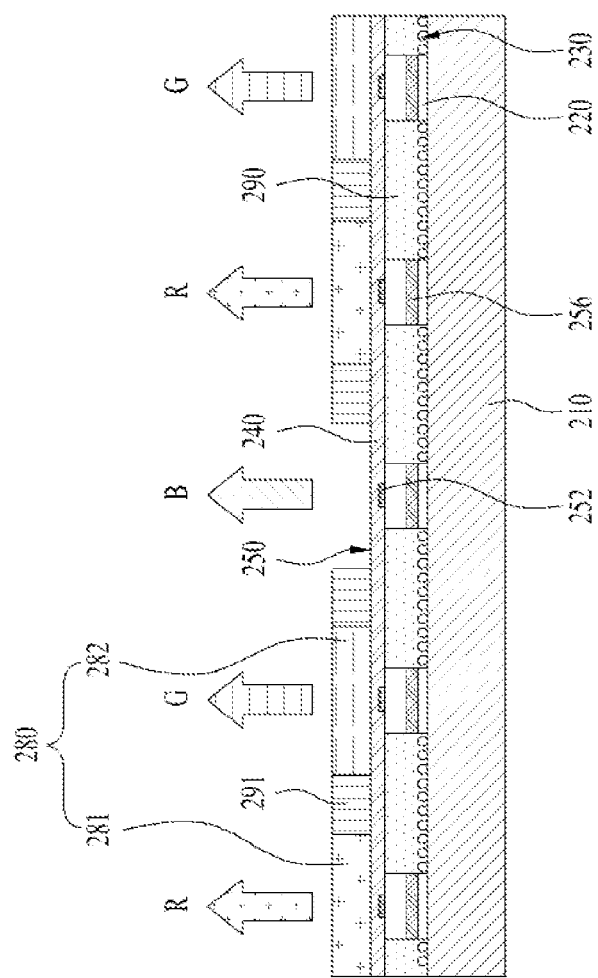
FIG. 8 is a cross-sectional diagram taken along a cutting line D-D shown in FIG. 8.
Figure 9:
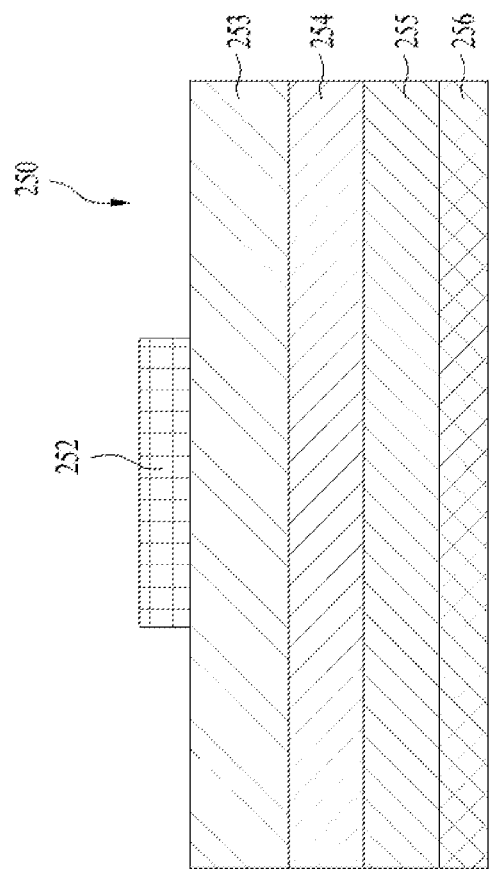
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 µm for example and the individual semiconductor light emitting element 250 may include a rectangular or square element. For example, the rectangular element may have a size equal to or smaller than 20 µm×80 µm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the above-described display device using the semiconductor light emitting element of the present disclosure, the semiconductor light emitting element is disposed on a wiring substrate in a flip chip type and is used as an individual pixel.

Figure 10:
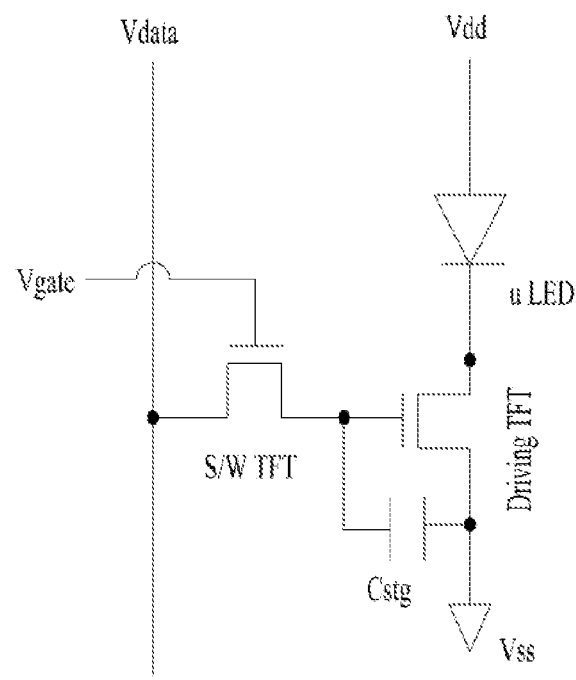
FIG. 10 is a circuit diagram of a pixel drive unit of a display device using a light emitting element of an active matrix type according to a first embodiment of the present disclosure.

FIG. 10 is a circuit diagram of a pixel drive unit of a display device using a light emitting element of an active matrix type according to a first embodiment of the present disclosure.

The pixel drive unit includes a driving thin film transistor Driving TFT directly connected to a light emitting element uLED and a switching thin film transistor SW TFT connected to a data line Vdata and a gate line Vgate to perform a switching operation.

Thus, there are four major wirings (Vdd, Vss, Vdata and Vgate) in a single pixel, and an assembly wiring (see 310 in FIG. 11) for assembly of the light emitting element uLED is added thereto. Such wirings and Thin Film Transistors (TFTs) are connected so as to drive the light emitting element uLED in each pixel.

By the thin film transistor TFT connected to the data line Vdata and the gate line Vgate, a pixel transistor region is formed.

In addition, by the thin film transistor TFT, a light emitting region (or a display region) in which an individual light emitting element uLED is formed.

An individual pixel region is formed in a manner of including the pixel transistor region and the light emitting region, and a plurality of the individual pixel regions form a display.

As described above, there are four major wirings Vdd, Vss, Vdata and Vgate in a single pixel.

The four wirings may include a gate line Vgate connected to a switching thin film transistor SW TFT, a data line Vdata connected to the switching thin film transistor SW TFT, a gate OFF voltage line Vss connected to a driving thin film transistor Driving TFT, and a gate ON voltage line Vdd connected to an anode of a light emitting element uLED.

Here, the gate ON voltage Vdd corresponds to the highest voltage applied to drive the light emitting element uLED.

When a driving voltage Vdata and a common voltage Vgate are applied, a switching operation for determining ON/OFF of a signal transfer is performed in the switching thin film transistor S/W TFT.

By such a switching operation, a voltage substantially applied to the light emitting element uLED depending on the driving voltage Vdata and a current flowing in the light emitting element uLED according to the voltage are determined in the driving thin film transistor Driving TFT.

Namely, in the switching thin film transistor S/W TFT, an operation may occur in a switching region. In the driving thin film transistor Driving TFT, an operation may occur in a linear region before saturation.

In addition, an assembly wiring may be disposed to induce a Dielectrophoresis (DEP) effect by an electric field when a semiconductor light emitting element forming an individual pixel is assembled.

In this case, the assembly wiring 310 may be used for self-assembly of semiconductor light emitting elements.

Here, the self-assembly may mean a process in which a plurality of semiconductor light emitting elements having grown on a wafer are separated from each other, dispersed in fluid, and then assembled on a substrate using an electric field.

Thus, by the dielectrophoresis induced by the assemble electrode 310, the semiconductor light emitting element that forms the individual pixel may be temporarily fixed to each pixel region.

Figure 11:
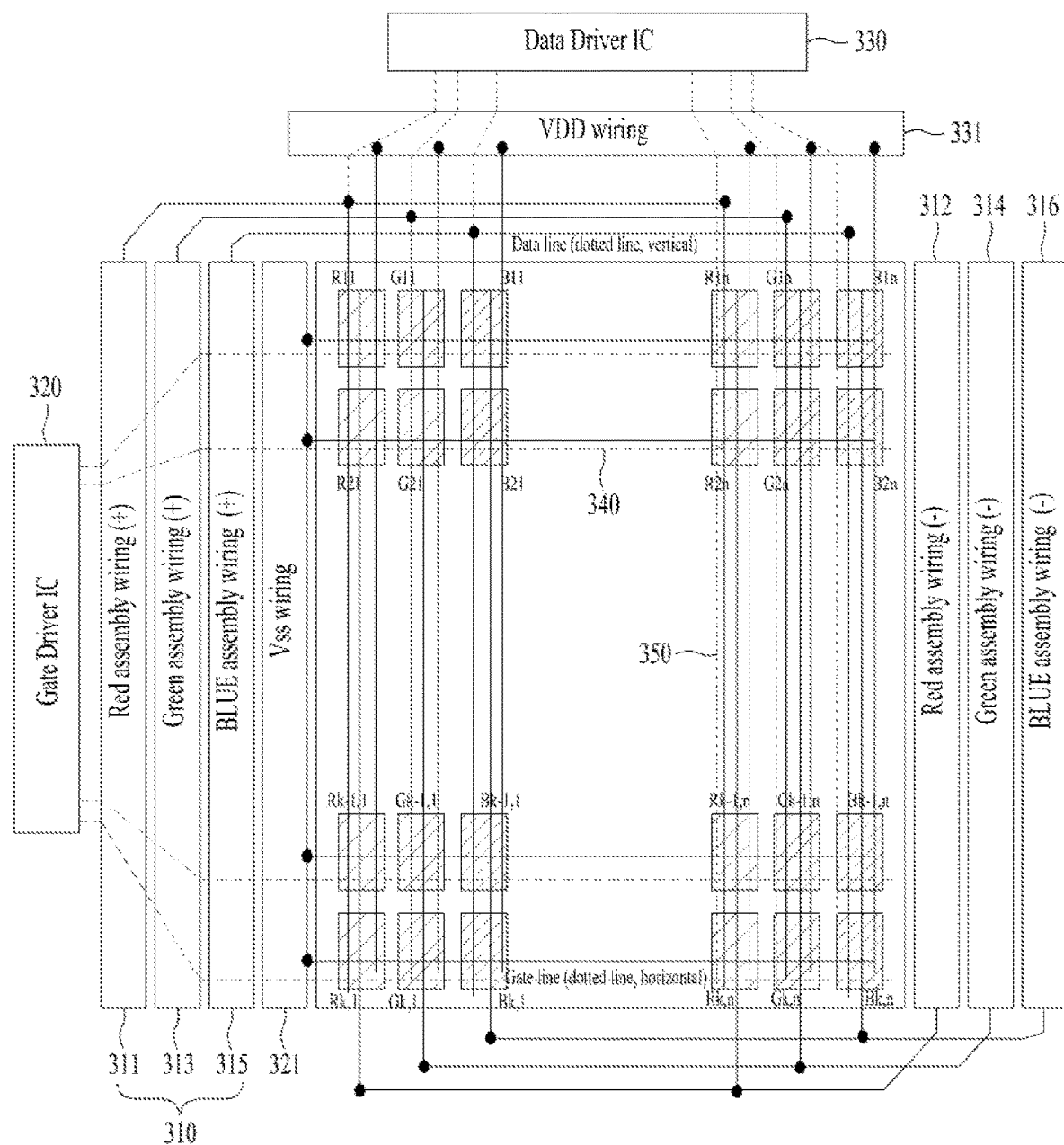
FIG. 11 is pixel layout including a wiring structure of a display device using a light emitting element of an active matrix type according to a first embodiment of the present disclosure.

FIG. 11 is pixel layout including a wiring structure of a display device using a light emitting element of an active matrix type according to a first embodiment of the present disclosure.

Referring to FIG. 11, regarding pixel disposition according to a first embodiment, each pixel may include a red pixel R having a red light emitting element installed therein, a green pixel G having a green light emitting element installed therein, and a blue pixel R having a blue light emitting element installed therein.

In this case, k red pixels R may be arranged in a vertical direction (e.g., R11 to Rk1). Likewise, k green pixels G and k blue pixels B may be arranged in the vertical direction.

In addition, in a horizontal direction, n red pixels R, n green pixels G and n blue pixels B may be arranged in a manner of forming a single pixel (e.g., a combination (R1$n$, G1$n$, B1$n$)) with a red pixel R, a green pixel G and a blue pixel B.

An assembly wiring 310 may be disposed on at least one side (e.g., both sides) of such a pixel arrangement. The assembly wiring 310 may include assembly wirings 311 and 312 for red pixel R, assembly wirings 313 and 314 for green pixel G, and assembly wirings 315 and 316 for blue pixel B.

The assembly wiring 310 may be arranged to pass through all individual pixel regions. In this case, the assembly wiring may be disposed per color. For example, a pair of assembly wirings 311 and 312 connecting a multitude of red pixels R11 to R1$k$ arranged in the vertical direction may be arranged. Likewise, a pair of assembly wirings 313 and 314 connecting a multitude of green pixels G11 to G1$k$ arranged in the vertical direction may be arranged. And, a pair of assembly wirings 315 and 316 connecting a multitude of blue pixels B11 to B1$k$ arranged in the vertical direction may be arranged.

In the above structure, a gate drive unit (Gate Driver IC) 320 is located on a width side of the pixel arrangement, whereby a gate line (Vgate) 340 connected to the gate drive unit 320 may be connected in a width direction (i.e., a horizontal direction) of the pixel arrangement.

In this case, a gate OFF voltage line (Vss) 321 may be connected in the width direction of the pixel arrangement equally to the gate line (Vgate) 340.

In some implementations, a data drive unit (Data Driver IC) 330 may be located on a height side of the pixel arrangement, whereby a data line (Vdata) 350 connected to the data drive unit 330 may be connected in a height direction (i.e., a vertical direction) of the pixel arrangement.

In this case, a gate ON voltage line (Vdd) 331 may be connected in the height direction of the pixel arrangement equally to the data line (Vdata) 350.

Figure 12:
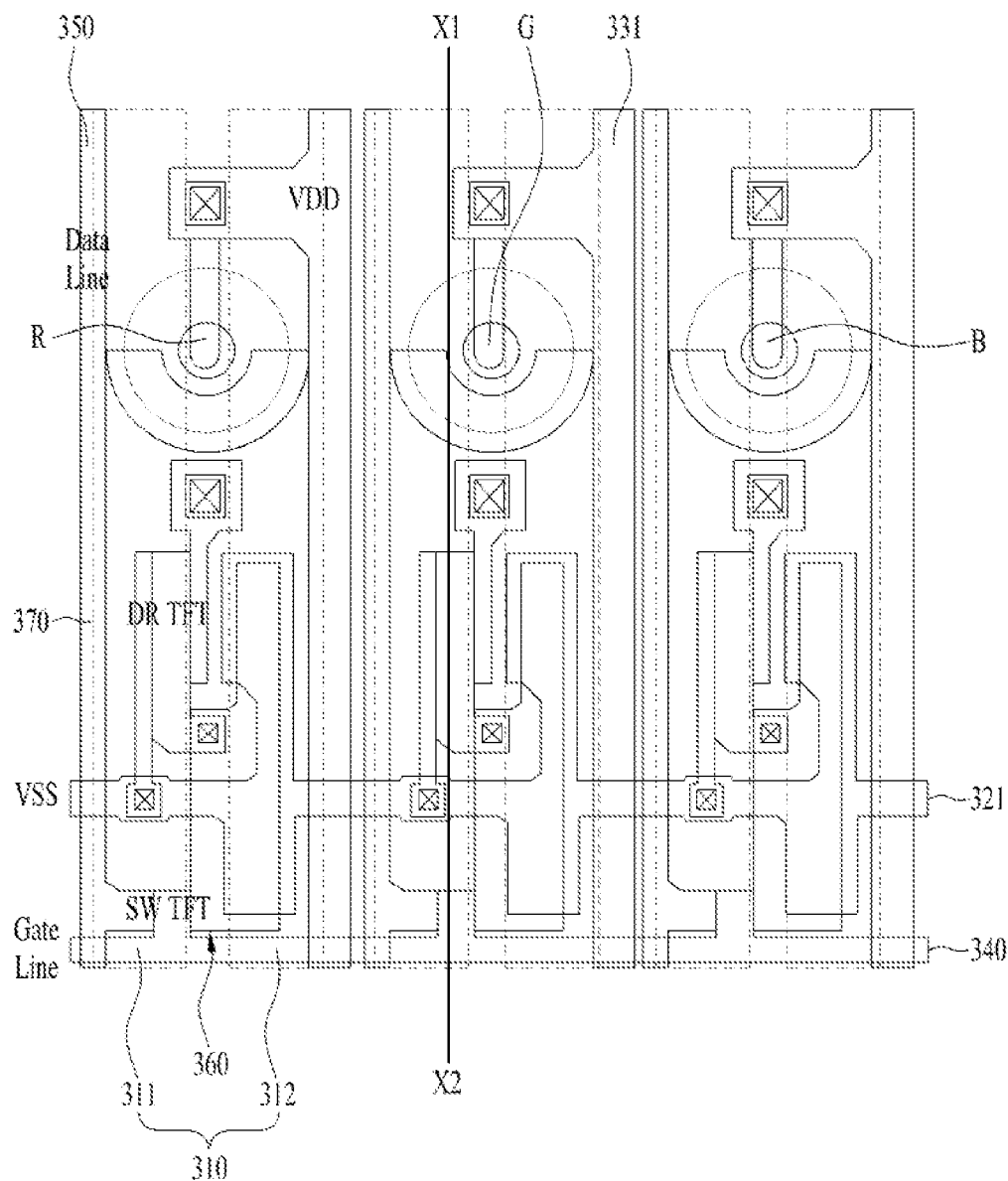
FIG. 12 illustrates an actual pixel structure including a wiring structure of a display device using a light emitting element of an active matrix type according to a first embodiment of the present disclosure.

FIG. 12 illustrates an actual pixel structure including a wiring structure of a display device using a light emitting element of an active matrix type according to a first embodiment of the present disclosure.

Referring to FIG. 12, a state that three individual pixels are disposed adjacent to each other. Here, the three pixels correspond to a red pixel R, a green pixel G and a blue pixel B, respectively.

Regarding a leftmost pixel for example, a red light emitting region R is located on an upper side, and a driving thin film transistor (DR TFT) 370 and a switching thin film transistor (SW TFT) 360 are located in order below the red light emitting region R.

In this case, a data line 350 is arranged lengthwise on a lest side of each pixel region and a gate ON voltage line (Vdd) 331 is arranged lengthwise on a right side of the pixel region.

In addition, a gate OFF voltage line (Vss) 321 and a gate line 340 are arranged in a width direction on a lower side of each pixel region.

Figure 13:
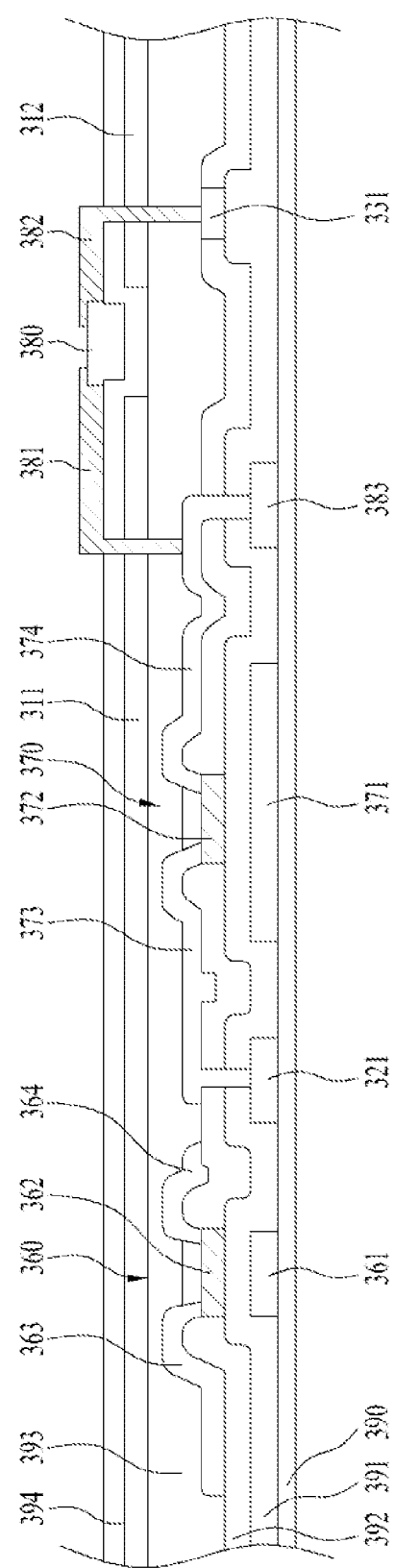
FIG. 13 is a cross-sectional diagram taken along a line X1-X2 in FIG. 12.

FIG. 13 is a cross-sectional diagram taken along a line X1-X2 in FIG. 12.

Referring to FIG. 13, it may be observed that the pixel structure shown in FIG. 12 is disposed three-dimensionally.

In such a pixel structure, a gate metal 361 forming a gate line 340, a gate OFF voltage line (Vss) 321 and a metal layer 371 for a storage capacitor may be disposed on a substrate 390.

A gate insulating layer 391 may be located on a base layer comprised of metal. In this case, a switching thin film transistor 360 may be located on the gate metal 361 and a driving thin film transistor 370 may be located on the metal layer 371 for the storage capacitor.

Hence, an active layer 362 for the switching thin film transistor 360 may be located on the gate metal 361 and an active layer 372 for the driving thin film transistor 370 may be located on the metal layer 371. In addition, a gate ON voltage line (Vdd) 331 may be located on a side at which a light emitting element 380 is located.

A passivation layer 392 may be located to cover the active layer 362/372, and a source layer 363/373 and a drain layer 364/374 connected to each active layer 362/372 may be located on the passivation layer 392.

An assembly wiring 311/312 may be located on a first interlayer 393 covering the source layer 363/373 and the drain layer 364/374.

A second interlayer 394 may be located on the assembly wiring 311/312, and a light emitting element 380 mounted by a force applied by the assembly wiring 311/312 may be installed.

A cathode of the light emitting element 380 may be connected to an N pad 381, and the N pad 381 may be connected to the drain layer 374 of the driving thin film transistor 370 by penetrating the first interlayer 393 and the second interlayer 394.

In addition, an anode of the light emitting element 380 may be connected to a P pad 382, and the P pad 382 may be connected to the gate ON voltage line (Vdd) 331 by penetrating the first interlayer 393 and the second interlayer 394.

Figure 14:
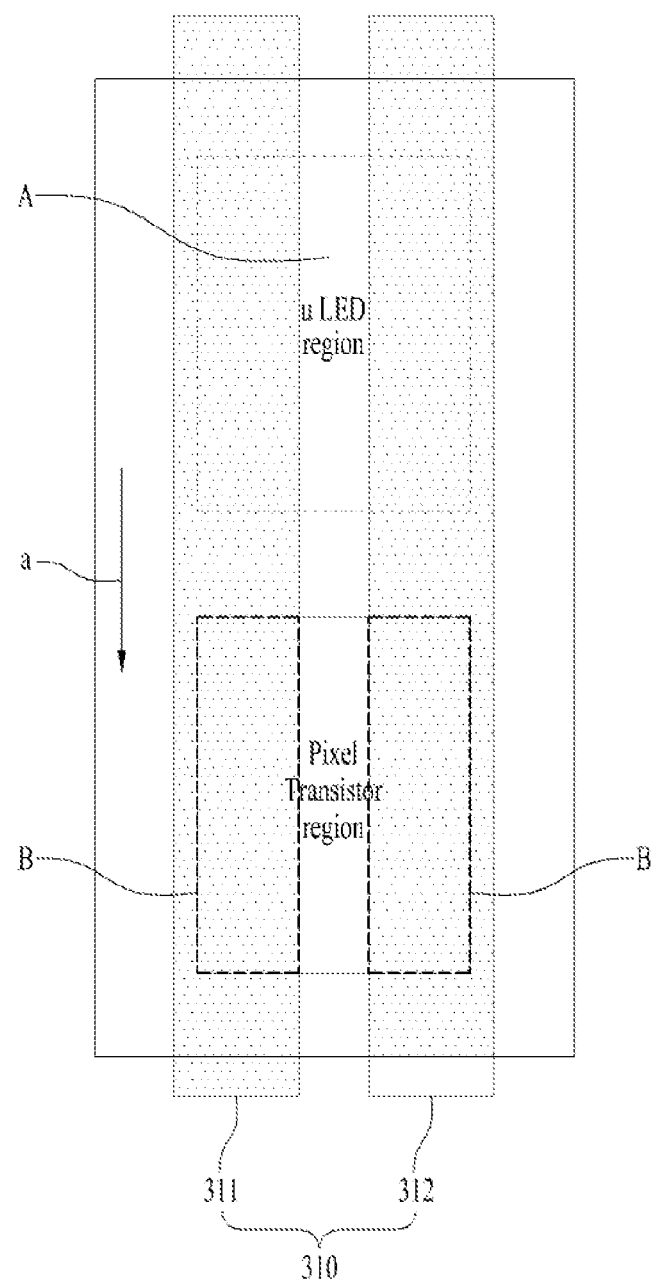
FIG. 14 illustrates an individual pixel region of a display device using a light emitting element of an active matrix type according to a first embodiment of the present disclosure.

FIG. 14 illustrates an individual pixel region of a display device using a light emitting element of an active matrix type according to a first embodiment of the present disclosure.

Referring to FIG. 14, as described above, it is able to form a multitude of pixel regions arranged on a substrate 390, and each of the pixel regions includes a light emitting region (uLED region) A and a pixel transistor region.

In this case, between the substrate 390 and the pixel region layer, an assembly wiring layer 310 including assembly wirings 311 and 312 forming a multitude of pairs may be provided.

In addition, the pixel transistor region provided with a thin film transistor for turning on the light emitting element may be located in a first direction a with respect to the light emitting region A.

As described above with reference to the first embodiment, a photolithography process is applicable to forma wiring and thin film transistor in a pixel of a predetermined size.

Thus, as a multitude of wirings are formed, short circuit and interference may occur between adjacent pixels due to conductive particles and the like, thereby causing bright spot defects.

In addition, as described above, the assembly wiring 310 required for assembly may be provided within the pixel for the self-assembly of the light emitting element uLED.

However, by the assembly wiring 310, the characteristics of the thin film transistors 360 and 370 for driving may be changed. For example, an overlap region B may be formed between a region of the assembly wiring 310 and the pixel transistor region. Yet, such an overlap region B may function as a capacitor.

Therefore, a negative shift effect of a transistor characteristic line may occur, thereby causing defects such as occurrence of a bright spot error and the like.

As described above, the overlap region B is formed between the region of the assembly wiring 310 and the pixel transistor region, when the assembly wiring passes by the thin film transistor in the pixel entirely or in part, the active region of the thin film transistor 360/370 is activated to accumulate charges or cause inversion, thereby forming a channel. Through such a channel, a current path may be formed.

The above-formed current path may cause in-pixel leakage, thereby causing a defect effect of distorting a data signal. Namely, a crosstalk effect between an assembly wiring and a thin film transistor in a pixel may occur.

It may cause a problem that it is difficult to be compatible with the self-assembly structure of light emitting elements assembled per color to design an assembly wiring in a horizontal direction not to overlap with a thin film transistor in order to avoid the crosstalk effect described above.

Figure 15:
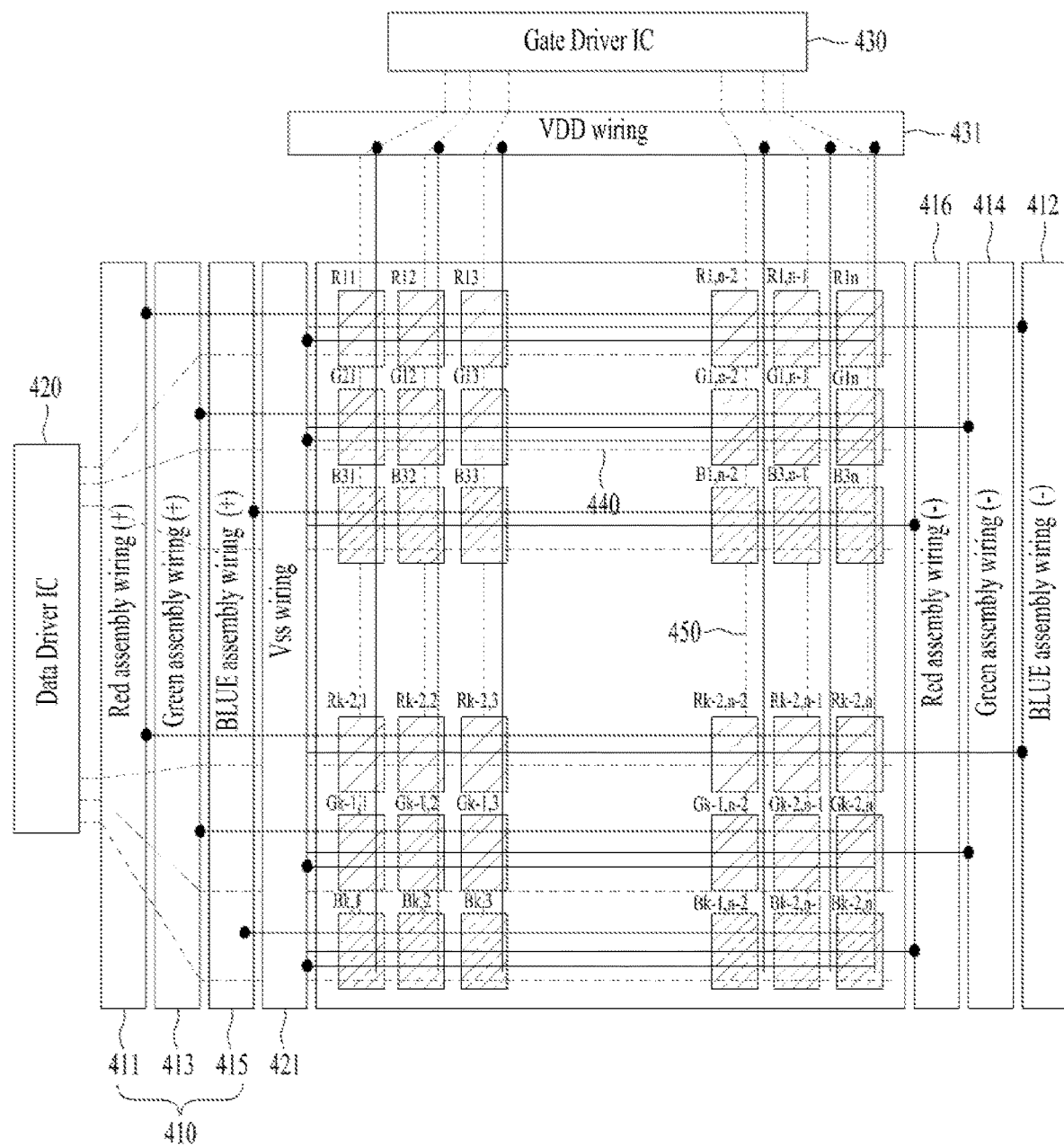
FIG. 15 is a diagram of a pixel layout including a wiring structure of a display device using a light emitting element of an active matrix type according to a second embodiment of the present disclosure.

FIG. 15 is a diagram of a pixel layout including a wiring structure of a display device using a light emitting element of an active matrix type according to a second embodiment of the present disclosure.

Referring to FIG. 12, regarding pixel disposition according to a second embodiment, each pixel may include a red pixel R having a red light emitting element installed therein, a green pixel G having a green light emitting element installed therein, and a blue pixel R having a blue light emitting element installed therein.

In this case, n red pixels R may be arranged in a horizontal direction (e.g., R11 to R1n). Likewise, n green pixels G and n blue pixels B may be arranged in the horizontal direction.

In addition, in a vertical direction, k red pixels R, k green pixels G and k blue pixels B may be arranged in a manner of forming a single pixel (e.g., a combination (Rk1, Gk1, Bk1)) with a red pixel R, a green pixel G and a blue pixel B.

An assembly wiring 410 may be disposed on at least one side (e.g., both sides) of such a pixel arrangement. The assembly wiring 410 may include assembly wirings 411 and 412 for red pixel R, assembly wirings 413 and 414 for green pixel G, and assembly wirings 415 and 416 for blue pixel B.

The assembly wiring 410 may be arranged to pass through all individual pixel regions. In this case, the assembly wiring may be disposed per color. For example, a pair of assembly wirings 411 and 412 connecting a multitude of red pixels R11 to R1n arranged in the horizontal direction may be arranged. Likewise, a pair of assembly wirings 413 and 414 connecting a multitude of green pixels G11 to G1n arranged in the horizontal direction may be arranged. And, a pair of assembly wirings 415 and 416 connecting a multitude of blue pixels B11 to B1*n* arranged in the horizontal direction may be arranged.

In the above structure, a data drive unit (Data Driver IC) 420 is located on a width side of the pixel arrangement, whereby a data line (Vdata) 450 connected to the data drive unit 420 may be connected in a width direction (i.e., a horizontal direction) of the pixel arrangement.

In this case, a gate OFF voltage line (Vss) 421 may be connected in the width direction of the pixel arrangement equally to the data line (Vdata) 450.

In some implementations, a gate drive unit (Gate Driver IC) 430 may be located on a height side of the pixel arrangement, whereby a gate line (Vgate) 440 connected to the gate drive unit 430 may be connected in a height direction (i.e., a vertical direction) of the pixel arrangement.

In this case, a gate ON voltage line (Vdd) 431 may be connected in the height direction of the pixel arrangement equally to the gate line (Vgate) 440.

Figure 16:
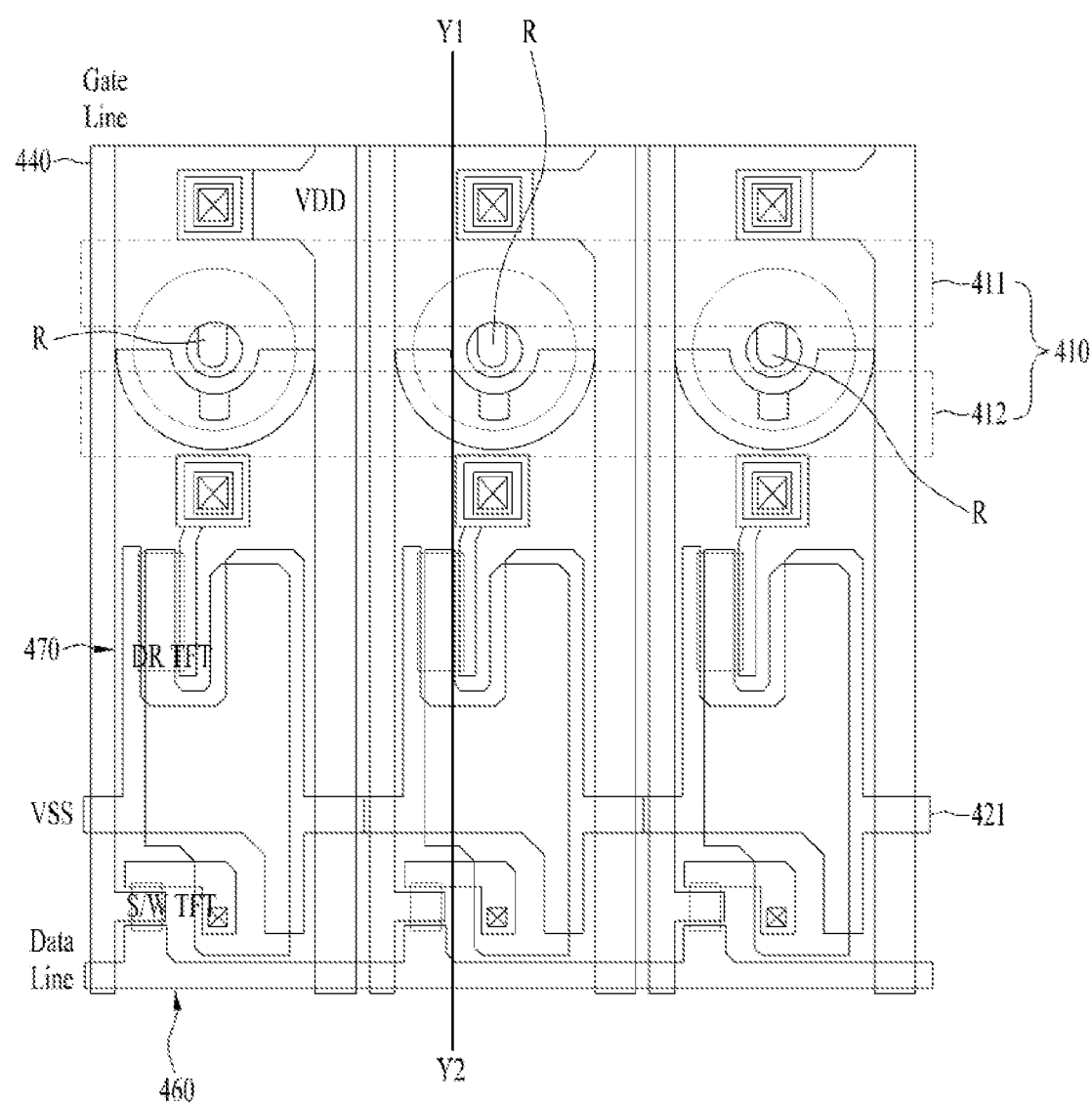
FIG. 16 illustrates an actual pixel structure including a wiring structure of a display device using a light emitting element of an active matrix type according to a second embodiment of the present disclosure.

FIG. 16 illustrates an actual pixel structure including a wiring structure of a display device using a light emitting element of an active matrix type according to a second embodiment of the present disclosure.

Referring to FIG. 16, a state that three individual pixels are disposed adjacent to each other. Here, all the three pixels correspond to red pixels R. Namely, the pixels in the same color may be arranged in a width direction.

Regarding a leftmost pixel for example, a red light emitting region R is located on an upper side, and a driving thin film transistor (DR TFT) 470 and a switching thin film transistor (SW TFT) 460 are located in order below the red light emitting region R.

In this case, a gate line 440 is arranged lengthwise on a lest side of each pixel region and a gate ON voltage line (Vdd) 431 is arranged lengthwise on a right side of the pixel region.

In addition, a gate OFF voltage line (Vss) 421 and a data line 450 are arranged in a width direction on a lower side of each pixel region.

Figure 17:
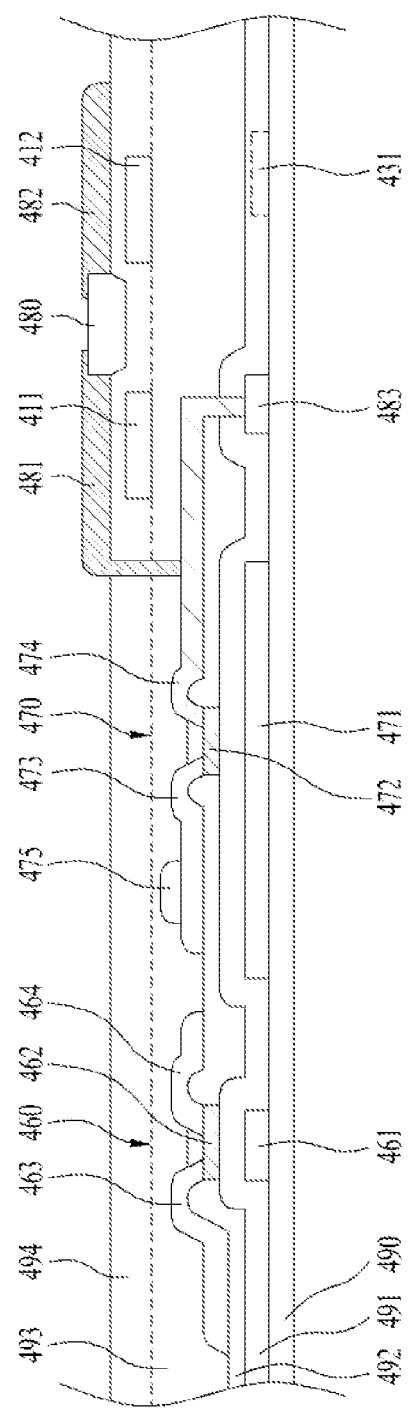
FIG. 17 is a cross-sectional diagram taken along a line Y1-Y2 in FIG. 16.

FIG. 17 is a cross-sectional diagram taken along a line Y1-Y2 in FIG. 16.

Referring to FIG. 17, it may be observed that the pixel structure shown in FIG. 16 is disposed three-dimensionally.

In such a pixel structure, a gate metal 461 forming a gate line 440, a metal layer 471 for a storage capacitor a gate ON voltage line (Vdd) 431 and may be disposed on a substrate 490.

A gate insulating layer 491 may be located on a base layer comprised of metal. In this case, a switching thin film transistor 460 may be located on the gate metal 461 and a driving thin film transistor 470 may be located on the metal layer 471 for the storage capacitor.

Hence, an active layer 462 for the switching thin film transistor 460 may be located on the gate metal 461 and an active layer 472 for the driving thin film transistor 470 may be located on the metal layer 471.

A passivation layer 492 may be located to cover the active layer 462/472, and a source layer 463/473 and a drain layer 464/474 connected to each active layer 462/472 may be located on the passivation layer 492.

An assembly wiring 411/412 may be located on a first interlayer 493 covering the source layer 463/473 and the drain layer 464/474.

A second interlayer 494 may be located on the assembly wiring 411/412, and a light emitting element 480 mounted by a force applied by the assembly wiring 411/412 may be installed.

A cathode of the light emitting element 480 may be connected to an N pad 481, and the N pad 481 may be connected to the drain layer 474 of the driving thin film transistor 470 by penetrating the first interlayer 493 and the second interlayer 494.

In addition, an anode of the light emitting element 480 may be connected to a P pad 482, and the P pad 482 may be connected to the gate ON voltage line (Vdd) 431 by penetrating the first interlayer 493 and the second interlayer 494.

Thus, the gate ON voltage line 431 may be disposed on the same layer of the gate line 440.

In addition, the metal 475 forming the gate OFF voltage line 421 may be provided to the same layer of the source region (source layer) 473 of the driving thin film transistor 470.

Figure 18:
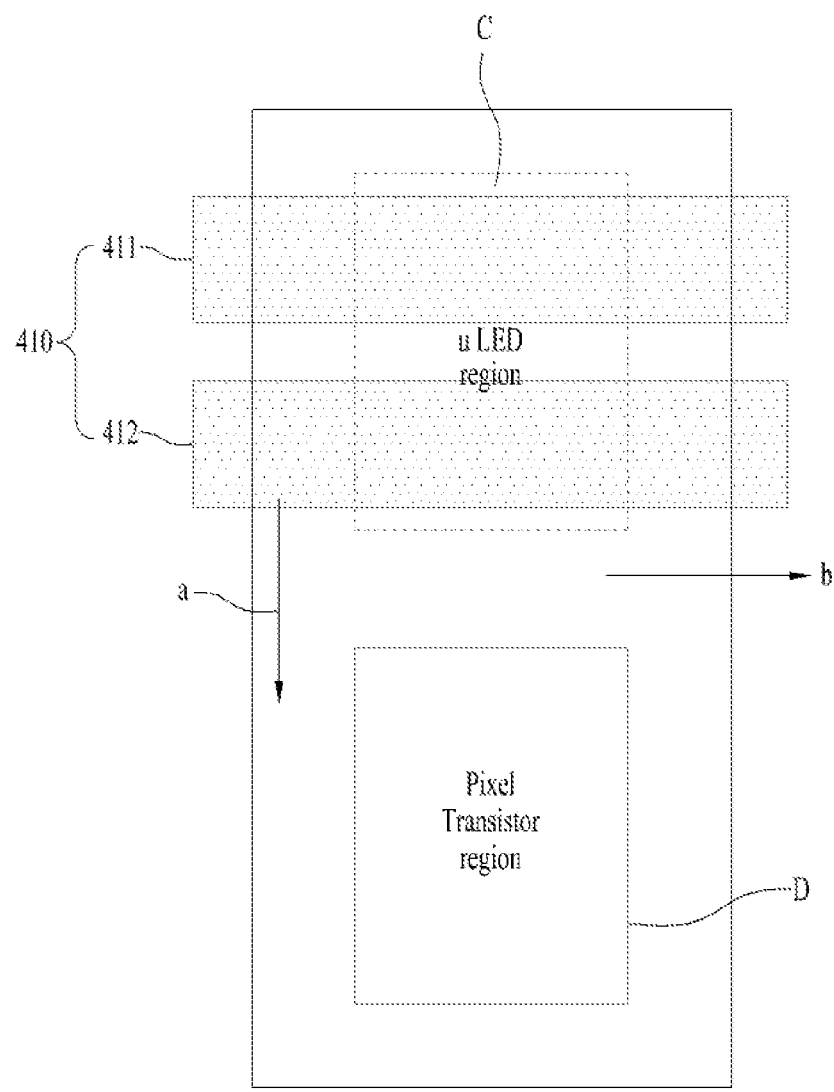
FIG. 18 illustrates an individual pixel region of a display device using a light emitting element of an active matrix type according to a second embodiment of the present disclosure.

FIG. 18 illustrates an individual pixel region of a display device using a light emitting element of an active matrix type according to a second embodiment of the present disclosure.

Referring to FIG. 14, as described above, it is able to form a multitude of pixel regions arranged on a substrate 490 and each of the pixel regions includes a light emitting region (uLED region) C and a pixel transistor region D.

In this case, between the substrate 490 and the pixel region layer, an assembly wiring layer 410 including assembly wirings 411 and 412 forming a multitude of pairs may be provided.

In addition, the pixel transistor region provided with a thin film transistor for turning on the light emitting element may be located in a first direction a with respect to the light emitting region A.

Yet, the assembly wirings 411 and 412 may be disposed in a direction different from the first direction a. Namely, the assembly wirings 411 and 412 may be disposed in a second direction b vertical to the first direction a.

Therefore, overlapping between the assembly wiring 411/412 and the pixel transistor region D may not occur.

In the above pixel structure, at least one of the gate line (Vgate) 440 or the gate OFF voltage line (Vss) 421 may be disposed parallel with the assembly wiring 410.

In addition, the gate ON voltage line (Vdd) 431 may be connected to the anode of the light emitting element 480 and the gate OFF voltage line 421 may be disposed in a direction vertical to the assembly wiring 410.

In some implementations, the data line 450 and the gate ON voltage line 431 may be disposed in a direction vertical to the assembly wiring 410.

Thus, according to the second embodiment of the present disclosure, an overlap region is not formed between the region of the assembly wiring 410 and the pixel transistor region. Therefore, the problem of the first embodiment described above may be solved.

Namely, the active region of the thin film transistor 460/470 is activated to accumulate charges or cause inversion, thereby forming a channel. Hence, it is able to prevent an effect that a current path may be formed through such a channel.

The above-formed current path may cause in-pixel leakage, thereby causing a defect effect of distorting a data signal. Hence, it is able to prevent occurrence of a crosstalk effect between an assembly wiring and a thin film transistor in a pixel.

It is able to provide a solution compatible with the self-assembly structure of light emitting elements assembled per color to design an assembly wiring in a horizontal direction not to overlap with a thin film transistor in order to avoid the crosstalk effect described above FIG. 19 illustrates an actual pixel structure including a wiring structure of a display device using a light emitting element of an active matrix type according to a third embodiment of the present disclosure.

Figure 19:
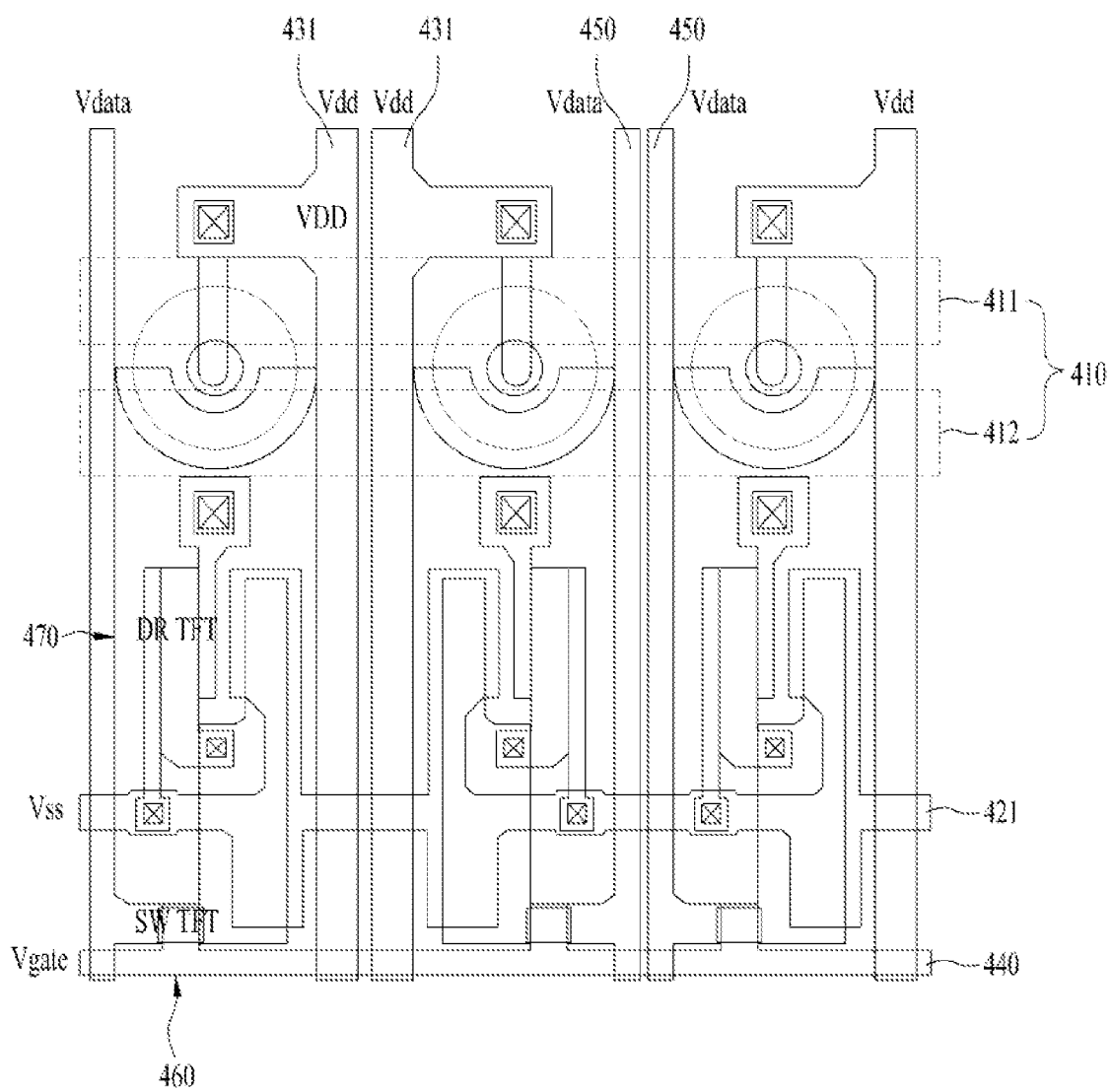
FIG. 19 illustrates an actual pixel structure including a wiring structure of a display device using a light emitting element of an active matrix type according to a third embodiment of the present disclosure.

Referring to FIG. 19, a state that three individual pixels are disposed adjacent to each other. Here, the three pixels correspond to a red pixel R, a green pixel G and a blue pixel B, respectively.

Regarding a leftmost pixel for example, a red light emitting region R is located on an upper side, and a driving thin film transistor (DR TFT) 470 and a switching thin film transistor (SW TFT) 460 are located in order below the red light emitting region R.

In this case, a data line 450 is arranged lengthwise on a lest side of each pixel region and a gate ON voltage line (Vdd) 431 is arranged lengthwise on a right side of the pixel region.

In addition, a gate OFF voltage line (Vss) 421 and a gate line 440 are arranged in a width direction on a lower side of each pixel region.

The gate line 440 and the data line 450 are disposed in the same manner of the case of the first embodiment.

Yet, an assembly wiring 410 is disposed in a width direction of a light emitting region, which is the same as the case of the second embodiment.

Referring to FIG. 19, it can be observed that the data line 450 and the gate ON voltage line 431 are formed adjacent to each other in each light emitting region.

Namely, in the leftmost pixel region, the data line 450 may be located on the left side and the gate ON voltage line 431 may be located on the right side. On the contrary, in an adjacent pixel region, the data line 450 may be located on the right side and the gate ON voltage line 431 may be located on the left side.

Thus, the data line 450 and the gate ON voltage line 431 may be disposed symmetrically to each other in a multitude of light emitting regions with respect to a direction vertical to the assembly wiring 410.

The above disposition of the data line 450 and the gate ON voltage line 431 may be equally applicable to the pixel and electrode dispositions of the first and second embodiments described above.

Therefore, it is able to fundamentally prevent the occurrence of short circuit between the data line 450 and the gate ON voltage line 431.

Since a pixel region is very narrow and becomes smaller, a short circuit may occur between the data line 450 and the gate ON voltage line 431. Then, in the corresponding pixel where a short circuit occurs, the light is turned on with a minimum brightness, and thus a light emission defect may occur.

However, according to the present disclosure, this effect can be fundamentally solved.

Figure 20:
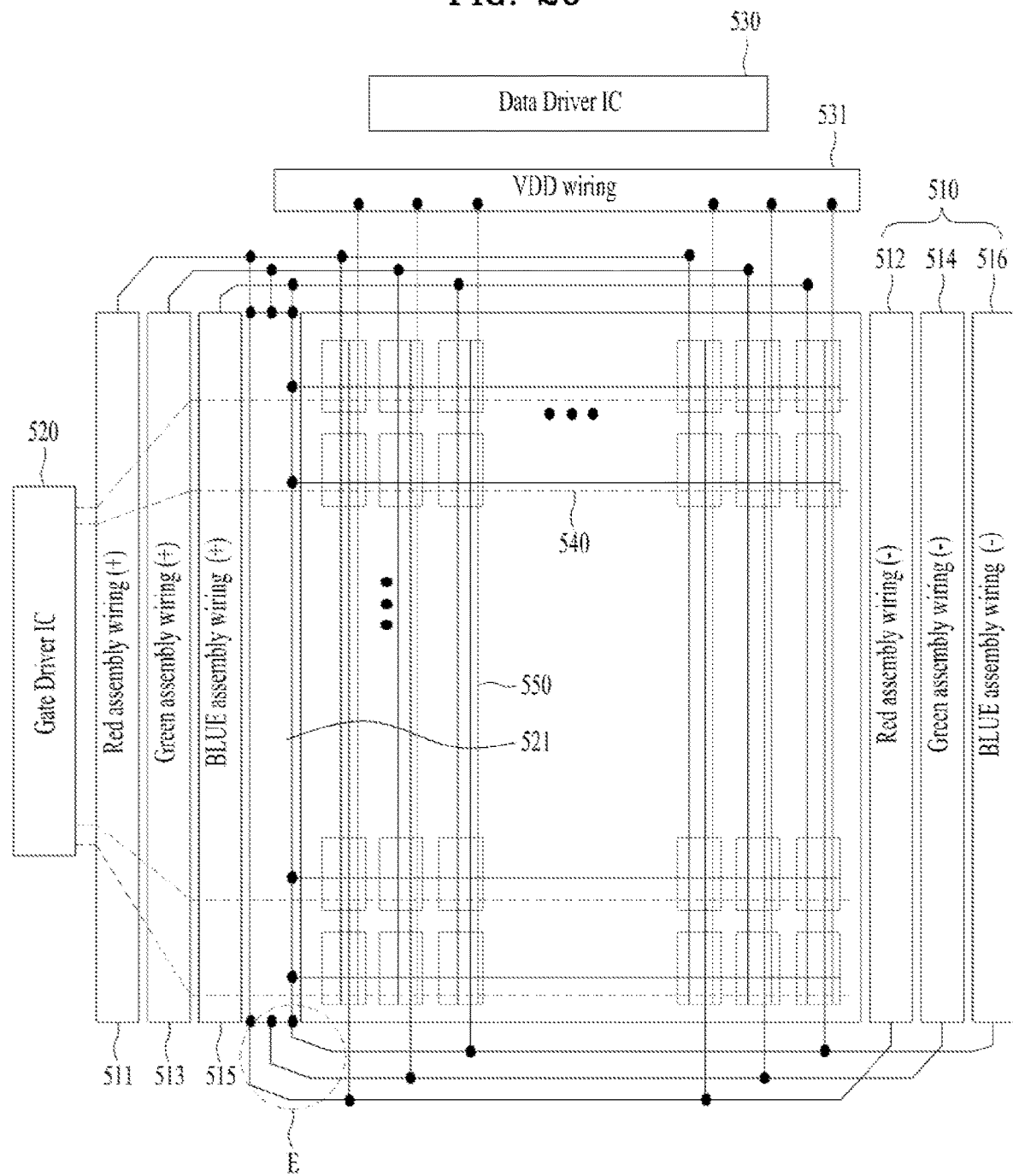
FIG. 20 illustrates a wiring structure of a display device using a light emitting element of an active matrix type according to a fourth embodiment of the present disclosure.

FIG. 20 illustrates a wiring structure of a display device using a light emitting element of an active matrix type according to a fourth embodiment of the present disclosure.

The wiring structure shown in FIG. 20 is generally the same as the case of the first embodiment described above.

However, unlike the case of the first embodiment, there is a difference (see part E) in which a gate OFF voltage line Vss 521 is connected to an assembly wiring 510. Since other matters are the same except for differences in reference numerals, redundant descriptions will be omitted. Furthermore, a matter in which the gate OFF voltage line (Vss) 521 is connected to the assembly wiring 510 may be equally applied to the second and third embodiments described above.

As described above, when implementing a display device of an active matrix drive type, a separate assembly wiring 510 is required to apply the self-assembly method of light emitting elements, and the corresponding assembly wiring 510 floats without applying a separate signal to a completed panel in implementing images of still or moving pictures after assembling the light emitting elements.

However, since the assembly wiring 510 to which no separate signal is applied is adjacent to the gate ON voltage line 531 or the data line 550 up to at least a few micrometers, it is affected by an adjacent signal, whereby charges may be accumulated. Accordingly, an effect of applying a constant power may occur.

When the crosstalk effect of the adjacent wiring occurs in the assembly wiring 510, the voltage of the adjacent wiring fluctuates, resulting in a defect in distorting the images of still or moving pictures.

To prevent such an image distortion effect, an assembly wiring structure and constant power application, which do not affect surrounding signal wirings on driving, may be required.

To prevent such an effect, the gate OFF voltage line (Vss) 521 may be connected to the assembly wiring 510.

Figure 21:
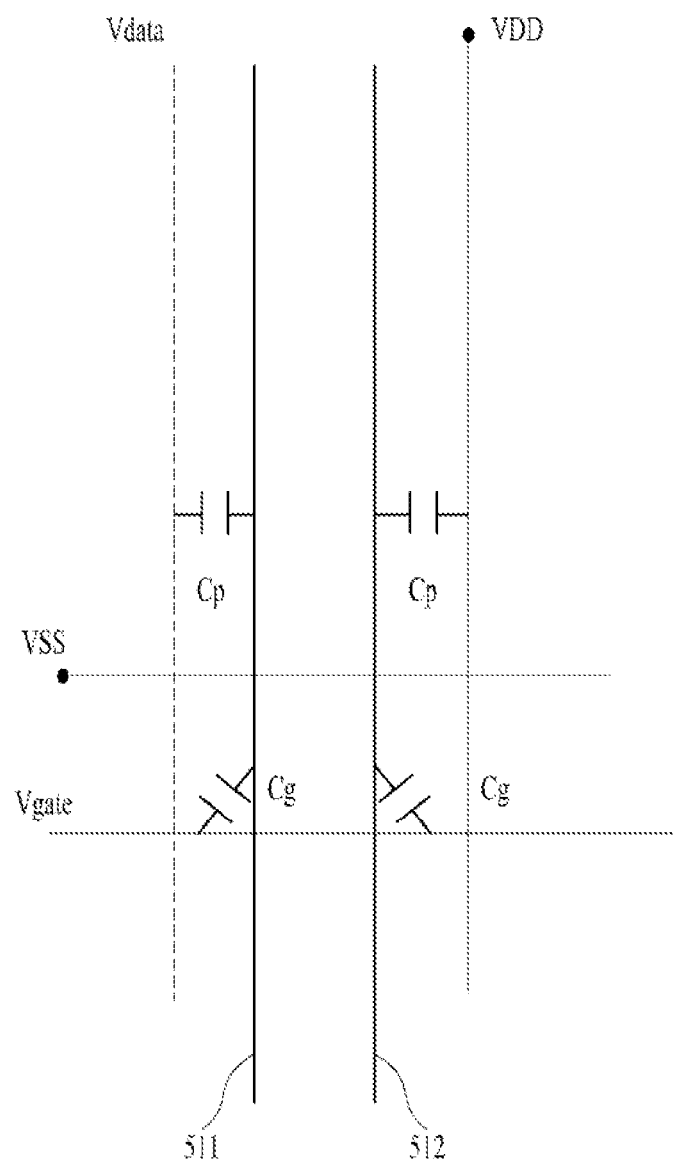
FIG. 21 shows capacitance of a display device using a light emitting element of an active matrix type according to a fourth embodiment of the present disclosure.

FIG. 21 illustrates capacitance of a display device using a light emitting element of an active matrix type according to a fourth embodiment of the present disclosure.

Referring to FIG. 21, parasitic capacitances of a gate ON voltage line (VDD) 531 and a data line (Vdata) 550 is represented.

As described above, while the gate OFF voltage line (Vss) 521 is connected to the assembly wiring 510, all of Cp, which is a parasitic capacitance near the gate OFF voltage line (Vss) 521, has a determined value, so that the data line (Vdata) 550 may maintain an applied signal of its own.

In some cases, by compensating for the determined value, the data line (Vdata) 550 may maintain an applied signal of its own.

Likewise, as all of parasitic capacitance Cg near the gate line (Vgate) 540 has a determined value, the gate line (Vdata) may maintain an applied signal of its own.

In some cases, by compensating for the determined value, the gate line (Vdata) 550 may maintain an applied signal of its own.

Referring to the signal waveform diagram of FIG. 22, when viewed from the data line (Vdata) 550 and the gate line Vdata 540, since the assembly wiring 510 is connected to the gate OFF voltage line (Vss) 521 which uses a lot of ground substantially, the data line (Vdata) 550 and the gate line (Vdata) 540 may operate at the original driving voltage.

Accordingly, distortion of a drive signal does not occur and the assembly wiring 510 can be stabilized.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

INDUSTRIAL APPLICABILITY

The present disclosure may provide a light emitting device using a semiconductor light emitting element in size of micrometer (μm) unit.

What is claimed is:

1. A display device of an active matrix type, the display device comprising:
a substrate;
a pixel region layer arranged on the substrate and including a multitude of pixel regions each including a light emitting region and a pixel transistor region; and
an assembly wiring layer including a multitude of pairs of assembly wiring provided between the substrate and the pixel region layer,
wherein for each pixel region, a corresponding pixel transistor region is positioned at a first direction with respect to a corresponding light emitting region and is configured to cause a corresponding semiconductor light emitting element of the light emitting region to be turned on, and
wherein the assembly wiring layer is disposed to induce a Dielectrophoresis (DEP) effect by an electric field,
wherein each of the multitude of pairs of assembly wiring is arranged along a second direction different from the first direction such that the region of the assembly wiring layer does not overlap with the pixel transistor region.

2. The display device of claim 1, wherein each pixel transistor region is provided with a driving thin film transistor provided at a first region and a switching thin film transistor provided at a second region.

3. The display device of claim 2, further comprising:
a gate line connected to the switching thin film transistor;
a data line connected to the switching thin film transistor;
a gate OFF voltage line connected to the driving thin film transistor; and
a gate ON voltage line connected to an anode of the semiconductor light emitting element,
wherein at least one of the gate line or the gate OFF voltage line is disposed to be parallel to a corresponding pair of assembly wiring.

4. The display device of claim 3, wherein the gate ON voltage line is connected to an anode of the semiconductor light emitting element, and wherein the gate ON voltage line is disposed along a direction perpendicular to the corresponding pair of assembly wiring.

5. The display device of claim 3, wherein the gate ON voltage line is disposed on a same layer as the gate line.

6. The display device of claim 3, wherein the gate OFF voltage line is electrically connected to the corresponding pair of assembly wiring.

7. The display device of claim 3, wherein the data line and the gate ON voltage line are disposed along a direction perpendicular to the corresponding pair of assembly wiring.

8. The display device of claim 7, wherein a corresponding data line and a corresponding gate ON voltage line are adjacent to each other in each light emitting region of the multitude of pixel regions.

9. A display device of an active matrix type, the display device comprising:
a substrate;
a pixel region layer arranged on the substrate and including a multitude of pixel regions each including a light emitting region and a pixel transistor region; and
an assembly wiring layer provided between the substrate and the pixel region layer and including a pair of assembly wiring corresponding to each of the light emitting regions,
wherein for each pixel region:
a corresponding pixel transistor region is positioned at one side of a corresponding light emitting region and is provided with at least one thin film transistor configured to cause a corresponding semiconductor light emitting element of the light emitting region to be turned on;
a gate line is connected to the thin film transistor; and
a data line is connected to the thin film transistor and is arranged to be parallel to a corresponding pair of assembly wiring,
wherein the assembly wiring layer is disposed to induce a Dielectrophoresis (DEP) effect by an electric field,
wherein for each pixel region, a corresponding pixel transistor region is positioned at a first direction with respect to a corresponding light emitting region, and
wherein each of the multitude of pairs of assembly wiring is arranged along a second direction different from the first direction such that the region of the assembly wiring layer does not overlap with the pixel transistor region.

10. The display device of claim 9, wherein the at least one thin film transistor of the pixel transistor region comprises a driving thin film transistor provided at a first region and a switching thin film transistor provided at a second region.

11. The display device of claim 10, further comprising:
a gate line connected to the switching thin film transistor;
a data line connected to the switching thin film transistor;
a gate OFF voltage line connected to the driving thin film transistor; and
a gate ON voltage line connected to an anode of the semiconductor light emitting element,
wherein at least one of the gate line or the gate OFF voltage line is disposed to be parallel to the corresponding pair of assembly wiring.

12. The display device of claim 11, wherein the gate ON voltage line is connected to an anode of the semiconductor light emitting element and wherein the gate ON voltage line is disposed along a direction perpendicular to the corresponding pair of assembly wiring.

13. The display device of claim 11, wherein the gate OFF voltage line is electrically connected to the corresponding pair of assembly wiring.

14. The display device of claim 11, wherein the data line and the gate ON voltage line are disposed along a direction perpendicular to the corresponding pair of assembly wiring.

* * * * *